(12) United States Patent
Yang et al.

(10) Patent No.: US 9,525,010 B2
(45) Date of Patent: Dec. 20, 2016

(54) ORGANIC LIGHT-EMITTING DIODE DISPLAY UNIT, DRIVING METHOD THEREOF AND DISPLAY DEVICE

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Haisheng Wang, Beijing (CN); Yiming Zhao, Beijing (CN); Xiao Sun, Beijing (CN); Peng Liu, Beijing (CN); Hongjuan Liu, Beijing (CN); Yingming Liu, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 14/787,808

(22) PCT Filed: Jan. 16, 2015

(86) PCT No.: PCT/CN2015/070894
§ 371 (c)(1),
(2) Date: Oct. 29, 2015

(87) PCT Pub. No.: WO2016/050015
PCT Pub. Date: Apr. 7, 2016

(65) Prior Publication Data
US 2016/0260781 A1 Sep. 8, 2016

(30) Foreign Application Priority Data
Sep. 29, 2014 (CN) .......................... 2014 1 0515749

(51) Int. Cl.
*H01L 27/32* (2006.01)
*G09G 3/32* (2016.01)

(52) U.S. Cl.
CPC ......... *H01L 27/3209* (2013.01); *G09G 3/3208* (2013.01); *H01L 27/3248* (2013.01); *G09G 2300/0439* (2013.01)

(58) Field of Classification Search
CPC ..................... G09G 3/3208; G09G 2300/0439; H01L 27/3209; H01L 27/3211; H01L 27/3248
(Continued)

(56) References Cited

U.S. PATENT DOCUMENTS 5,917,280 A * 6/1999 Burrows ............. H01L 27/3209
313/503
6,232,714 B1 * 5/2001 Shen ................... H01L 27/3209
257/98
(Continued)

FOREIGN PATENT DOCUMENTS

CN 1447629 A 10/2003
CN 1615059 A 5/2005
(Continued)

OTHER PUBLICATIONS

Jul. 7, 2015—International Search Report Appn PCT/CN2015/070894 with Eng Tran of Written Opinion.
(Continued)

*Primary Examiner* — Dmitriy Bolotin
(74) *Attorney, Agent, or Firm* — Banner & Witcoff, Ltd.

(57) ABSTRACT

An organic light-emitting diode display unit, a driving method thereof and a display device are disclosed. At least part of pixel units are pixel units each with a stacked structure; each pixel unit with the stacked structure includes two adjacent subpixel unit stacked groups; and each sub-
(Continued)

pixel unit stacked group includes at least two subpixel units which have different emitting colors and are stacked and insulated from each other. During display of different image frames, each subpixel unit stacked group in each pixel unit with the stacked structure can display gray-scale effect of at least two colors based on applied signals. Compared with an approach that each subpixel unit can only display gray-scale effect of only one color for different image frames, the display effect can be improved.

20 Claims, 14 Drawing Sheets

(58) Field of Classification Search
USPC ....... 345/76, 77, 204; 315/169.3, 169.2, 503
See application file for complete search history.

(56) References Cited

U.S. PATENT DOCUMENTS

| | | | | |
|---|---|---|---|---|
| 8,395,316 B2* | 3/2013 | Nagayama | .......... | H01L 27/3209 313/504 |
| 2002/0070909 A1 | 6/2002 | Asano et al. | | |
| 2004/0036421 A1* | 2/2004 | Arnold | ................ | G09G 3/3216 315/169.3 |
| 2005/0242712 A1* | 11/2005 | Sung | ................... | H01L 51/5278 313/503 |
| 2005/0264550 A1* | 12/2005 | Ohshima | .............. | G09G 3/3233 345/204 |
| 2007/0029941 A1* | 2/2007 | Ito | ........................ | G09G 3/3233 315/169.3 |
| 2009/0189834 A1 | 7/2009 | Ohshima et al. | | |
| 2010/0141693 A1 | 6/2010 | Lee et al. | | |
| 2011/0181178 A1* | 7/2011 | Vaudrey | .............. | H01L 27/3209 313/504 |
| 2014/0184669 A1* | 7/2014 | Oh | ........................ | G09G 3/3208 345/694 |
| 2015/0311262 A1* | 10/2015 | Wang | ................... | H01L 27/3213 257/40 |

FOREIGN PATENT DOCUMENTS

| | | |
|---|---|---|
| CN | 103779388 A | 5/2014 |
| CN | 104269431 A | 1/2015 |
| WO | 2009154288 A1 | 12/2009 |
| WO | 2014106335 A1 | 7/2014 |

OTHER PUBLICATIONS

Sep. 28, 2016—(CN)—First Office Action Appn 201410515749.X with English Tran.

* cited by examiner

ORGANIC LIGHT-EMITTING DIODE DISPLAY UNIT, DRIVING METHOD THEREOF AND DISPLAY DEVICE

The application is a U.S. National Phase Entry of International Application No. PCT/CN2015/070894 filed on Jan. 16, 2015, designating the United States of America and claiming priority to Chinese Patent Application No. 201410515749.X, filed on Sep. 29, 2014. The present application claims priority to and the benefit of the above-identified applications and the above-identified applications are incorporated by reference herein in their entirety.

TECHNICAL FIELD

At least one embodiment of the present disclosure relates to an organic light-emitting diode (OLED) display unit, a driving method thereof and a display device.

BACKGROUND

An OLED display unit is one of hotspots in the current research field of flat-panel display devices. Compared with liquid crystal display (LCD) devices, the OLED display unit has the advantages of low energy consumption, a low production cost, self-luminescence, a wide viewing angle, and a rapid response speed, etc. Currently, the OLED display unit has begun to replace the LCD devices in the flat-panel display field such as mobile phones, personal digital assistants (PDAs) and digital cameras.

The OLED display unit mainly includes: a base substrate and pixel units formed on the base substrate and arranged in a matrix. The pixel unit includes a plurality of subpixel units arranged in the same layer and pixel circuits which are respectively connected with the subpixel units in one-to-one correspondence. One subpixel unit includes an OLED structure.

SUMMARY

Embodiments of the present disclosure provide an OLED display unit, a driving method thereof and a display device, which are used for improving the pixel display effect of the OLED display unit.

At least one embodiment of the present disclosure provides an OLED display unit. The OLED display unit includes a base substrate and a plurality of pixel units disposed on the base substrate. The plurality of pixel units includes a plurality of subpixel units and pixel circuits which are respectively connected with the subpixel units in one-to-one correspondence. The subpixel units are OLED structures, and pixel circuits in a same pixel unit are respectively connected with different data signal lines. At least part of the pixel units are pixel units each with a stacked structure, where each of the pixel units with the stacked structure includes two adjacent subpixel unit stacked groups. Each subpixel unit stacked group includes at least two subpixel units which have different emitting colors and are stacked and insulated from each other, and a quantity of subpixel units in each subpixel unit stacked group of a same pixel unit with the stacked structure is identical. In each pixel unit with the stacked structure, two subpixel units disposed in a same layer form a subpixel unit layer; and in a same pixel unit with the stacked structure, only one subpixel unit layer includes two subpixel units that have same emitting colors, and other subpixel unit layers each include two subpixel units that have different emitting colors.

At least one embodiment of the present disclosure further provides a method for driving the OLED display unit. The method comprises: receiving video signals of images; and controlling, based on corresponding colors of an image at corresponding positions of the pixel units in the OLED display unit, subpixel units that display light of the corresponding colors and that are in the pixel units at the corresponding positions to display, where the image corresponds to a video signal of a current image frame.

The OLED display unit further includes: all of the pixel units with the stacked structure are regularly arranged; in each pixel unit with the stacked structure, two subpixel unit stacked groups are adjacent to each other along a row direction; arrangement positions of odd rows of pixel units with the stacked structure correspond to each other, and arrangement positions of even rows of pixel units with the stacked structure correspond to each other; and in two adjacent rows of pixel units with the stacked structure, two subpixel unit stacked groups which are adjacent to each other in position and have a same structure are misaligned. At least one embodiment of the present disclosure further provides a method for driving the OLED display unit, which includes: during display of an odd image frame, controlling one subpixel unit layer in each odd row of pixel units with the stacked structure to emit light, and during display of an even image frame, controlling another subpixel unit layer in each odd row of pixel units with the stacked structure to emit light; and during display of the odd image frame, controlling one subpixel unit layer in each even row of pixel units with the stacked structure to emit light, and during display of the even image frame, controlling another subpixel unit layer in each even row of pixel units with the stacked structure to emit light. Furthermore, during display of each image frame, subpixel units which emit light and are in the odd rows of pixel units with the stacked structure and subpixel units which emit light and are in the even rows of pixel units with the stacked structure are in different layers.

The OLED display unit further includes: all of the pixel units with the stacked structure are regularly arranged; in each pixel unit with the stacked structure, two subpixel unit stacked groups are adjacent to each other along the column direction; arrangement positions of odd columns of pixel units with the stacked structure correspond to each other, and arrangement positions of even columns of pixel units with the stacked structure correspond to each other; and in two adjacent columns of pixel units with the stacked structure, two subpixel unit stacked groups which are adjacent to each other in position and have a same structure are misaligned. At least one embodiment of the present disclosure further provides a method for driving the OLED display unit, which includes: during display of an odd image frame, controlling one subpixel unit layer in each odd column of pixel units with the stacked structure to emit light, and during display of an even image frame, controlling another subpixel unit layer in each odd column of pixel units with the stacked structure to emit light; and during display of the odd image frame, controlling one subpixel unit layer in each even column of pixel units with the stacked structure to emit light, and during display of the even image frame, controlling another subpixel unit layer in each even column of pixel units with the stacked structure to emit light. Furthermore, during display of each image frame, subpixel units which emit light and are in the odd columns of pixel units with the stacked structure and subpixel units which emit light and are in the even columns of pixel units with the stacked structure are in different layers.

At least one embodiment of the present disclosure further provides a display device, which includes the OLED display unit provided by the embodiments of the present disclosure.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

FIG. 12 is a flowchart of a method for driving the OLED display unit as shown in FIG. 7a; and FIG. 13 is a flowchart of a method for driving the OLED display unit as shown in FIG. 8a.

DETAILED DESCRIPTION

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

The shapes and sizes of layers in the accompanying drawings do not reflect the actual scale of the OLED display unit and only reflect a partial structure of the OLED display unit. The purpose is only to illustrate the content of the present disclosure.

Figure 1:
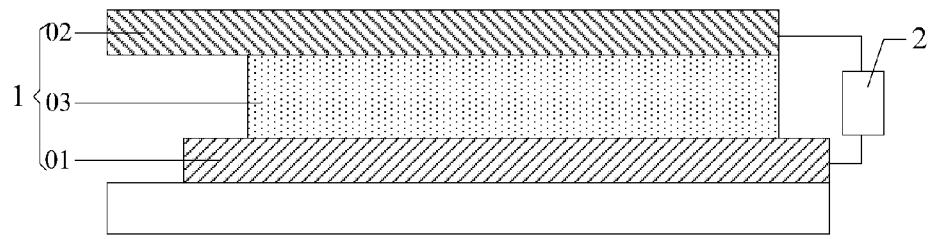
FIG. 1 is a schematic structural view of an OLED structure.

FIG. 1 is a schematic structural view of an OLED structure. As illustrated in FIG. 1, the OLED structure 1 generally includes an anode 01 and a cathode 02 arranged opposite to each other, and a light emission layer 03 disposed between the anode 01 and the cathode 02. The emission of light by the OLED display unit is achieved by the following means: a pixel circuit 2 applies a voltage between the anode 01 and the cathode 02; holes in the anode 01 and electrons in the cathode 02 are recombined in the light emission layer 03 to produce excitons; the excitons are migrated under the action of electric fields, to transfer energy to luminescent molecules in the light emission layer 03 and excite electrons in the luminescent molecules for the transition from the ground state to the excited state; and energy of the excited state is subjected to radiative transition to produces photons.

Different from the case that an LCD utilizes a stable voltage to control the brightness, the OLED is driven by a current and needs a stable current to control light emission. Due to technological process, device aging and other reasons, a threshold voltage $V_{th}$ of a driving transistor in a 2T1C (two thin-film transistors (TFTs) or metal-oxide-semiconductor (MOS) tubes and a capacitor) pixel circuit has unevenness, so that the current flowing through the OLED of each pixel can be changed, and hence the display brightness can be uneven. Therefore, the display effect of the entire image can be affected, and hence the brightness of different areas of the OLED display unit can be uneven.

Currently, in order to compensate the unevenness of the threshold voltage of the driving transistor in the pixel circuit, the number of TFTs and the number of capacitors in the pixel circuit are increased, and the threshold voltage drift of the driving transistor in the pixel circuit is compensated by the mutual cooperation of the TFTs and the capacitors. However, due to the increased number of the TFTs and the increased number of the capacitors in the pixel circuit, a reduction of the pixel size can be greatly limited, and hence the pixel display effect can be affected.

Therefore, in the case with a large amount of TFTs in the pixel circuit of the current OLED display unit, how to improve the pixel display effect has become the focus of attention of various manufacturers.

Figure 2:
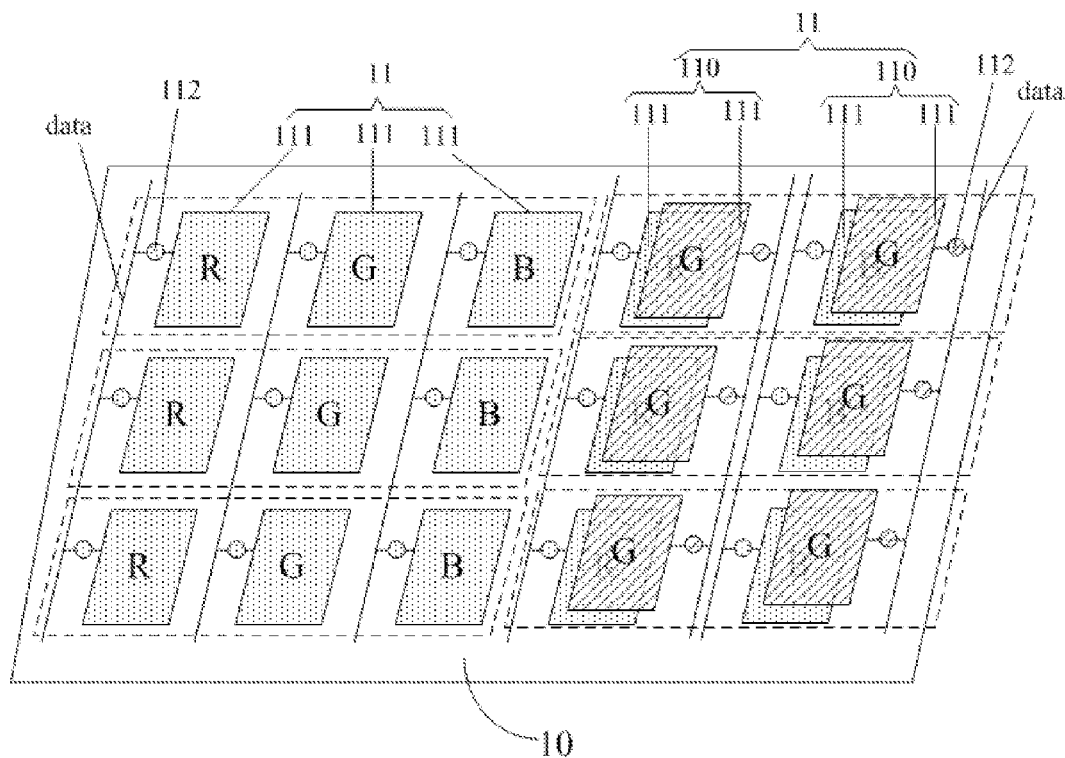
FIG. 2 is a schematic structural view of an OLED display unit provided by embodiments of the present disclosure.

At least one embodiment of the present disclosure provides an OLED display unit, which, as illustrated in FIG. 2, comprises a base substrate 10 and a plurality of pixel units 11 disposed on the base substrate 10. Each pixel unit 11 includes a plurality of subpixel units 111 and pixel circuits 112 which are respectively connected with the subpixel units 111 in one-to-one correspondence. The subpixel units 111 have OLED structures, and the pixel circuits 112 in the same pixel unit 11 are respectively connected with different data lines. At least a part of the pixel units 11 are pixel units 11 each with a stacked structure, and each pixel unit 11 with the stacked structure includes two adjacent subpixel unit stacked groups 110. Each subpixel unit stacked group 110 includes at least two subpixel units 111 which have different emitting colors and are stacked and insulated from each other, and the number of the subpixel units 111 of each subpixel unit stacked group 110 in the same pixel unit 11 with the stacked structure is the same. In the pixel unit 11 with the stacked structure, two subpixel units 111 disposed in the same layer are taken as a subpixel unit layer. In a same pixel unit 11 with the stacked structure, only one subpixel unit layer includes two subpixel units 111 having the same emitting color, and one or more other subpixel unit layers each include two subpixel units 111 having different emitting colors.

In the OLED display unit provided by the embodiments of the present disclosure, at least part of the pixel units are pixel units with a stacked structure, and each pixel unit with the stacked structure includes two adjacent subpixel unit stacked groups; each subpixel unit stacked group includes at least two subpixel units which have different emitting colors and are stacked and insulated from each other; and the number of the subpixel units of each subpixel unit stacked group in the same pixel unit with the stacked structure is the same. Therefore, during display of different image frames, each subpixel unit stacked group in each pixel unit with the stacked structure can display the gray-scale effect of at least two colors according to applied signals. Compared with the case that each subpixel unit can only display the gray-scale effect of one color for different image frames, the OLED display unit can improve the display effect because each subpixel unit stacked group can display more colors.

In addition, for a same pixel unit with the stacked structure from the pixel units with the stacked structure, only one subpixel unit layer includes two corresponding subpixel units that have the same emitting color, and the other subpixel unit layer includes two corresponding subpixel units that have different emitting colors. Therefore, a virtual display pixel arrangement effect can also be achieved by controlling emission of light of the subpixel units in different layers during display.

Figure 3:
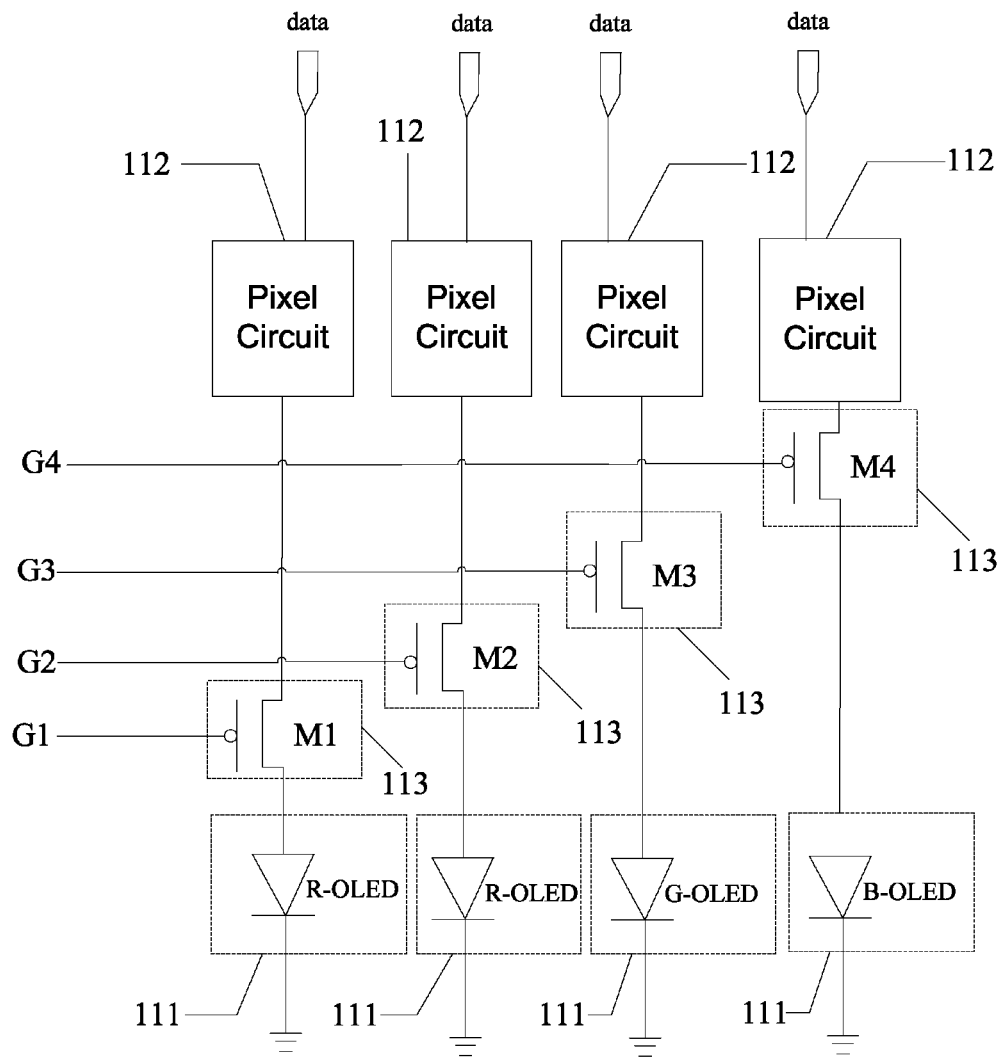
FIG. 3 is a schematic structural view of a pixel unit with a stacked structure provided by embodiments of the present disclosure.
Figure 4A:
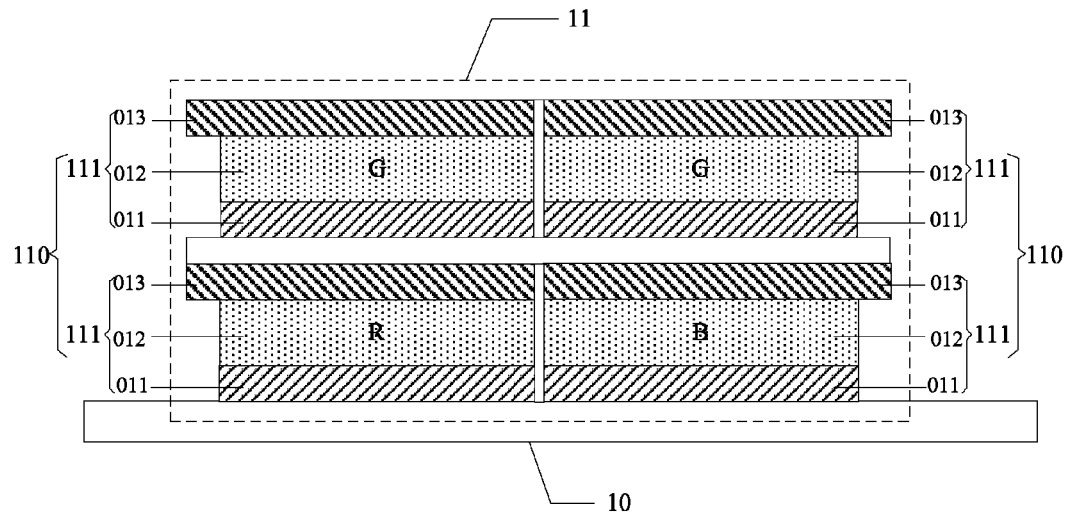
FIGS. 4a to 4f are respectively schematic structural views of a pixel unit with a stacked structure provided by embodiments of the present disclosure.
Figure 4B:
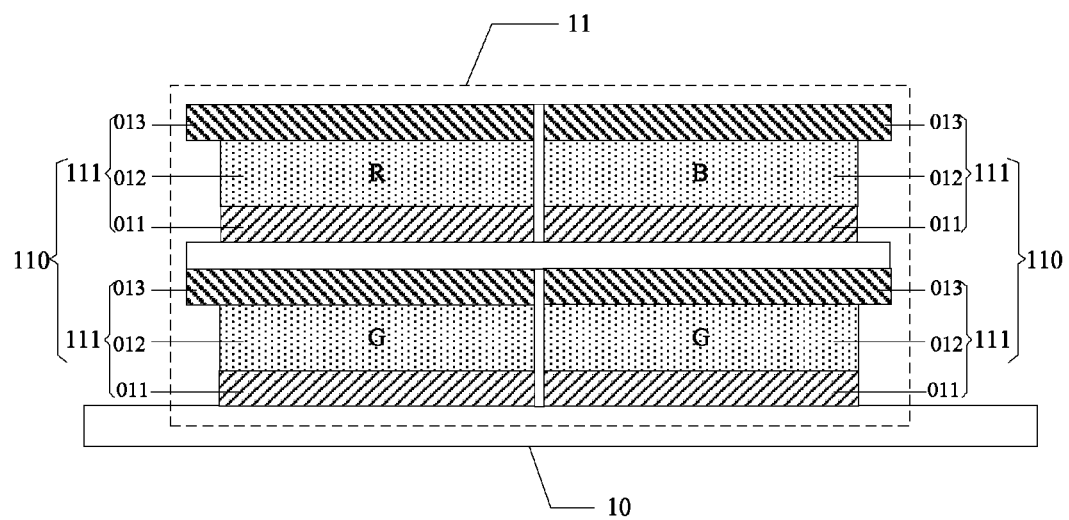
Figure 4C:
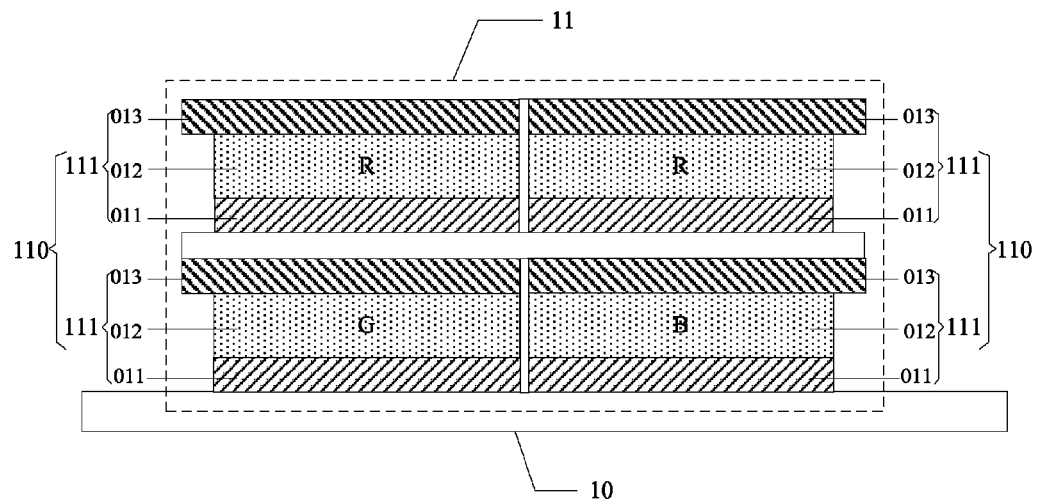
Figure 4D:
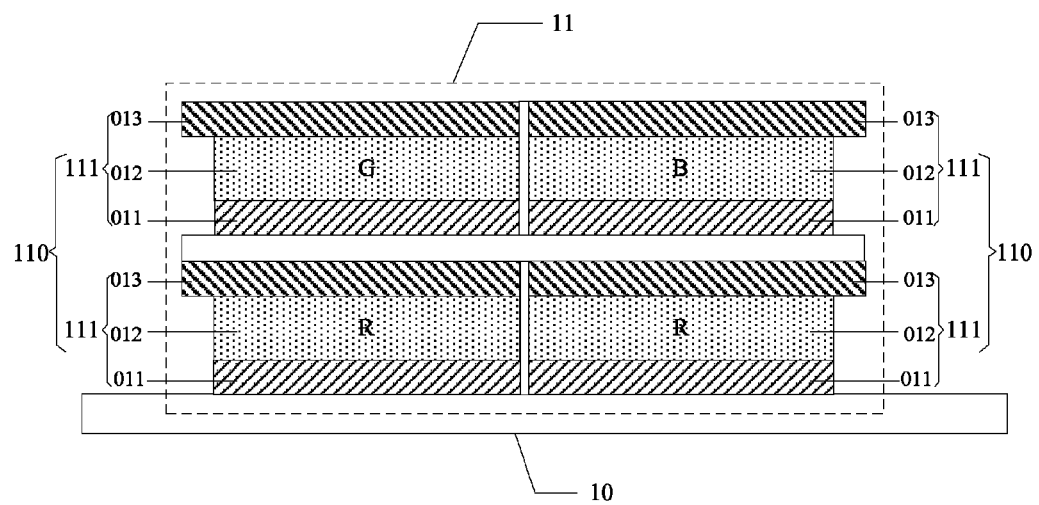
Figure 4E:
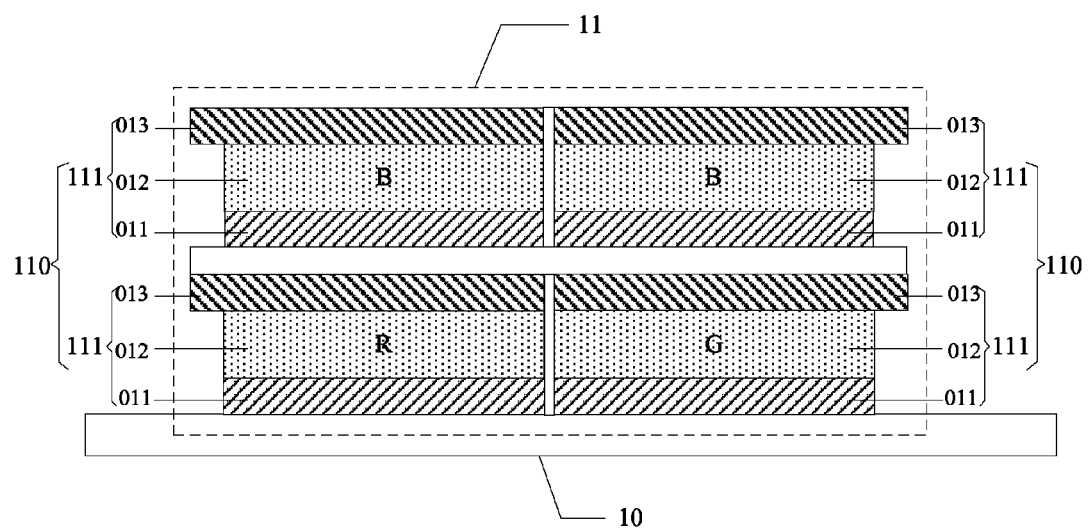
Figure 4F:
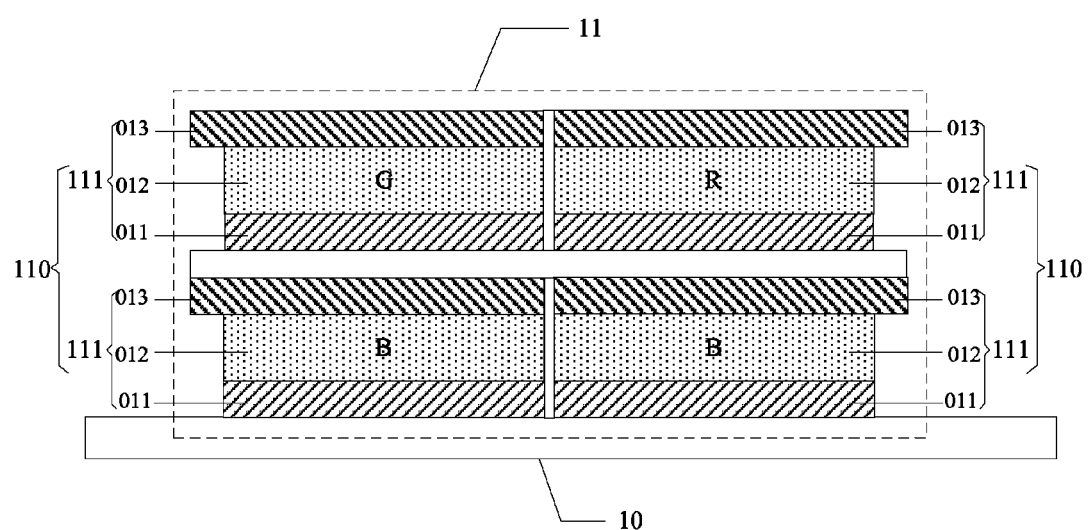

In at least one embodiment, in order to be able to independently control the subpixel units in the same pixel unit with the stacked structure, in the OLED display unit provided by the embodiments of the present disclosure as illustrated in FIG. 3, the subpixel units 111 in the same pixel unit 11 with the stacked structure are respectively connected with corresponding pixel circuits 112 through corresponding selector switches 113. The selector switches 113 are configured to respectively receive corresponding control signals which are used for controlling the switching on or off of the selector switches 113.

For instance, as illustrated in FIG. 3, one pixel unit 11 with the stacked structure includes four subpixel units 111. A first subpixel unit for emitting red light (R-OLED) is connected with a first pixel circuit 112 through a selector switch 113; the first pixel circuit 112 is connected with a corresponding data line (represented as "data" in FIG. 3); a corresponding control signal G1 controls to switch on or off of the selector switch 113. A second subpixel unit for emitting red light (R-OLED) is connected with a second pixel circuit 112 through a selector switch 113; the second pixel circuit 112 is connected with a corresponding data line; a corresponding control signal G2 controls to switch on or off of the selector switch 113. An OLED structure for emitting green light (G-OLED) is connected with a third pixel circuit 112 through a selector switch 113; the third pixel circuit 112 is connected with a corresponding data line; a corresponding control signal G3 controls to switch on or off of the selector switch 113. An OLED structure for emitting blue light (B-OLED) is connected with a fourth pixel circuit 112 through a selector switch 113; the fourth pixel circuit 112 is connected with a corresponding data line; and a corresponding control signal G4 controls to switch on or off of the selector switch 113. Thus, when displaying each image frame, within a same pixel unit with the stacked structure, each selector switch connected with a respective subpixel unit for displaying a corresponding color can be selected to be switched on based on the actual color of the current image frame, so that the subpixel units for displaying the corresponding colors in the pixel unit with the stacked structure can be driven to emit light. Moreover, because the pixel circuits connected with different subpixel units are connected with different data lines, different data signals can be applied to different pixel circuits according to the current image frame, and hence an arbitrary display can be achieved. Therefore, a same pixel unit with the stacked structure can display the gray-scale display effect of different colors according to the difference of each image frame. Compared with the case that each subpixel unit can only display the gray-scale display effect of one color, the OLED display unit described above can improve the display effect because each pixel unit with the stacked structure can display the gray-scale display effect of more colors. Particularly, for the OLED display unit in which each pixel unit with the stacked structure at least includes subpixel units for emitting red light, subpixel units for emitting green light and subpixel units for emitting blue light, the perfect display effect can be achieved. The perfect display effect refers to that the pixel units can display the display effect of any gray scale of red, green and blue (RGB), so that the display effect can be maximally improved.

In at least one embodiment, in the OLED display unit provided by the embodiments of the present disclosure as illustrated in FIG. 3, the selector switches 113 are switching transistors; gate electrodes of the switching transistors are connected with control signals (G1, G2, G3 and G4 in the figure) to control the switching on or off of the switching transistors, respectively; drain electrodes of the switching transistors are connected with corresponding subpixel units 111, respectively; and source electrodes of the switching transistors are connected with corresponding pixel circuits 112, respectively. As illustrated in FIG. 3, the first subpixel unit for emitting red light (R-OLED) is connected with the first pixel circuit 112 through a switching transistor M1, and a gate electrode of the switching transistor M1 is connected with the control signal G1; the second subpixel unit for emitting red light (R-OLED) is connected with the second pixel circuit 112 through a switching transistor M2, and a gate electrode of the switching transistor M2 is connected with the control signal G2; the OLED structure for emitting green light (G-OLED) is connected with the third pixel circuit 112 through a switching transistor M3, and a gate electrode of the switching transistor M3 is connected with the control signal G3; and the OLED structure for emitting blue light (B-OLED) is connected with the fourth pixel circuit 112 through a switching transistor M4, and a gate electrode of the switching transistor M4 is connected with the control signal G4.

It should be noted that: in the OLED display unit provided by the embodiments of the present disclosure, when the number of the subpixel units in each pixel unit with the stacked structure is greater, the display effect is better. However, a greater quantity of the subpixel units indicates that a thickness of the OLED display unit is larger. Thus, in actual application, the number of the subpixel units in each pixel unit with the stacked structure can be determined by a balance between the display effect and the thickness of the display unit.

In the OLED display unit provided by the embodiments of the present disclosure, the number of the subpixel units in each pixel unit with the stacked structure may be equal or may also be unequal. No limitation will be placed here.

For instance, in the OLED display unit provided by the embodiments of the present disclosure, as illustrated in FIGS. 4a to 4f, each subpixel unit stacked group 110 in each pixel unit 11 with the stacked structure includes two subpixel units 111, and the emitting colors of the four subpixel units 111 in the respective pixel unit 11 with the stacked structure are respectively red (R), blue (B), green (G) and red (R), or red (R), blue (B), green (G) and blue (B), or red (R), blue (B), green (G) and green (G).

In at least one embodiment, in order to simplify the manufacturing process, in the OLED display unit provided by the embodiments of the present disclosure, the sequence of the emitting colors of the four subpixel units in each pixel unit with the stacked structure is the same. That is, the pixel units each with the stacked structure have the same structure.

In at least one embodiment, in order to achieve a full-screen perfect display effect, all of the pixel units in the OLED display unit provided by the embodiments of the present disclosure are pixel units each with the stacked structure.

In a specific implementation, in the OLED display unit provided by the embodiments of the present disclosure, as illustrated in FIGS. 4a to 4f, the OLED structure generally includes an anode 011, a light emission layer 012 and a cathode 013 which are stacked in sequence. The anode is generally made from indium tin oxide (ITO) materials. The cathode is generally made from transparent metallic materials.

Figure 5:
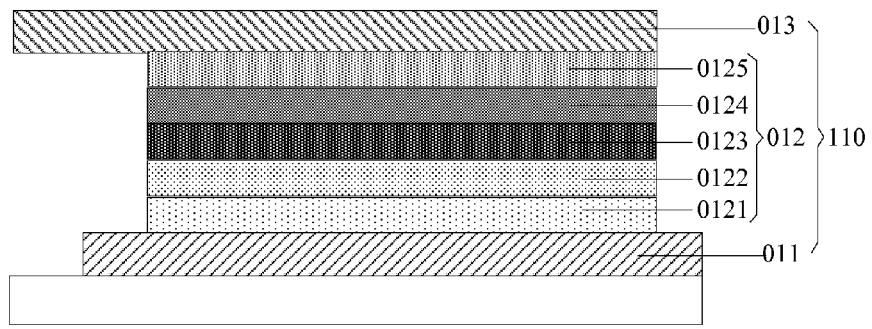
FIG. 5 is a schematic structural view of an OLED structure provided by embodiments of the present disclosure.

For instance, in the OLED structure as illustrated in FIG. 5 from the OLED display unit provided by the embodiments of the present disclosure, the light emission layer 012 may includes layers made from different organic materials, e.g., a hole injection layer (HIL) 0121, a hole transport layer (HTL) 0122, an organic light emission layer 0123, an electron transport layer (ETL) 0124 and an electron injection layer (EIL) 0125. The hole injection layer 0121 is close to the anode 011 and away from the cathode 013. The electron injection layer 0125 is close to the cathode 013 and away from the anode 011. As some other features of the OLED structure belongs to the art known by those skilled in the art, no further description will be given here.

In at least one embodiment, in order to simplify the structure, in the OLED display unit provided by the embodiments of the present disclosure, an electric potential of a cathode in each OLED structure of the same pixel unit with the stacked structure is equal. That is, each OLED structure in a same pixel unit with the stacked structure shares a cathode signal input terminal, so that the number of the cathode signal input terminals for inputting signals into the cathodes in the OLED display unit can be reduced. Of course, in a specific implementation, electric potentials of the cathodes in the OLED structures of the same pixel unit with the stacked structure may also be unequal. That is, the OLED structures are electrically connected with different cathode signal input terminals, respectively. No limitation will be placed herein.

In the OLED display unit provided by the embodiments of the present disclosure, an electric potential of a cathode of an OLED structure may be a negative voltage or may be zero. No limitation will be placed herein.

Figure 6A:
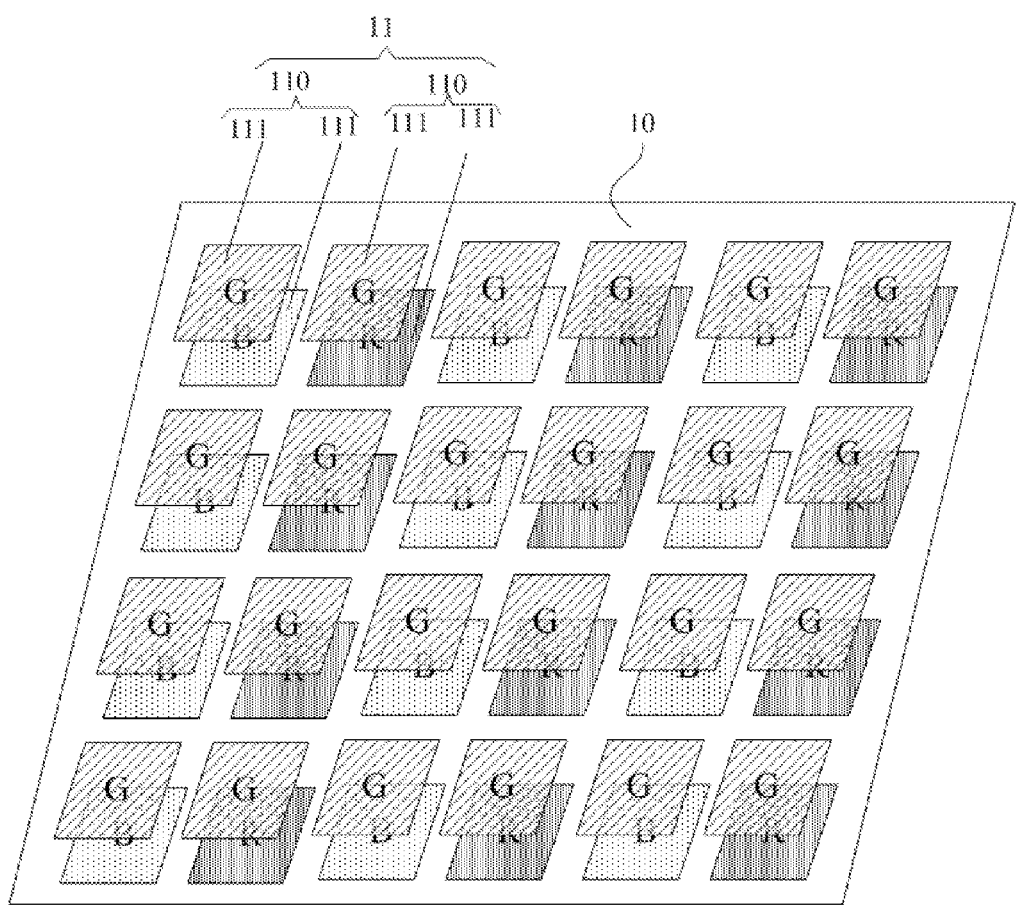
FIGS. 6a and 6b are respectively schematic structural views of an OLED display unit provided by embodiments of the present disclosure.
Figure 6B:
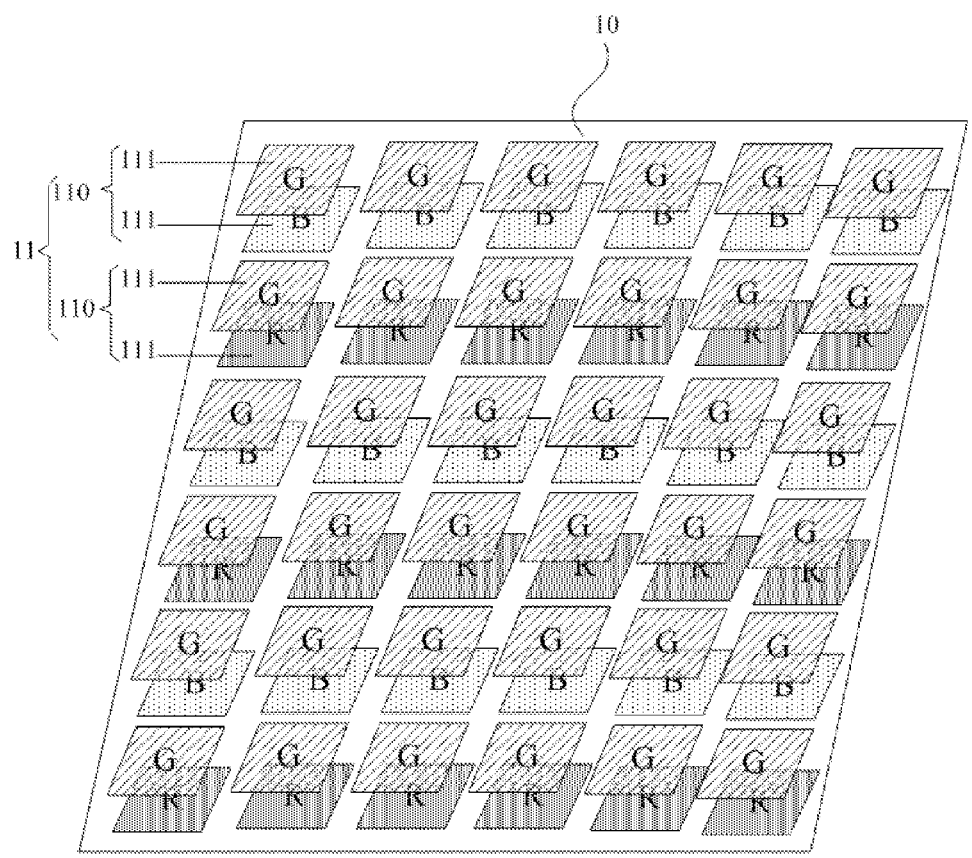

In at least one embodiment, in the OLED display unit provided by the embodiments of the present disclosure, as illustrated in FIGS. 6a and 6b, all of the pixel units 11 are pixel units each with the stacked structure; all of the pixel units 11 each with the stacked structure are arranged in a matrix; and in each pixel unit 11 with the stacked structure, two subpixel unit stacked group 110 are adjacent to each other along a row direction or a column direction.

Figure 7A:
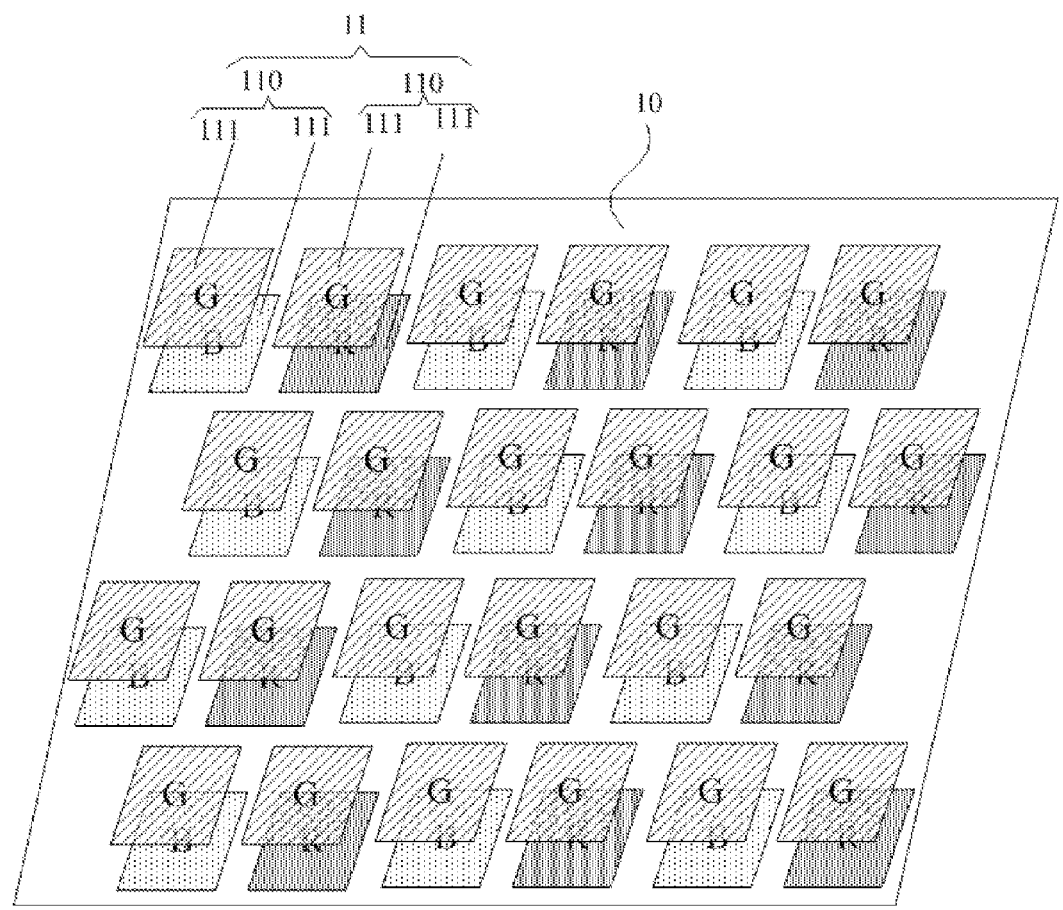
FIG. 7a is a schematic structural view of an OLED display unit provided by embodiments of the present disclosure.

Or in at least one embodiment, in the OLED display unit provided by the embodiments of the present disclosure, as illustrated in FIG. 7a, all of the pixel units 11 are pixel units 11 each with the stacked structure; all of the pixel units 11 each with the stacked structure are regularly arranged; in each pixel unit 11 with the stacked structure, two subpixel unit stacked groups 110 are adjacent to each other along the row direction; arrangement positions of odd rows of pixel units 11 each with the stacked structure correspond to each other, and arrangement positions of even rows of pixel units 11 each with the stacked structure correspond to each other; and in two adjacent rows of pixel units 11 each with the stacked structure, two subpixel unit stacked groups 110 which are adjacent to each other in position and have the same structure are misaligned.

Figure 7B:
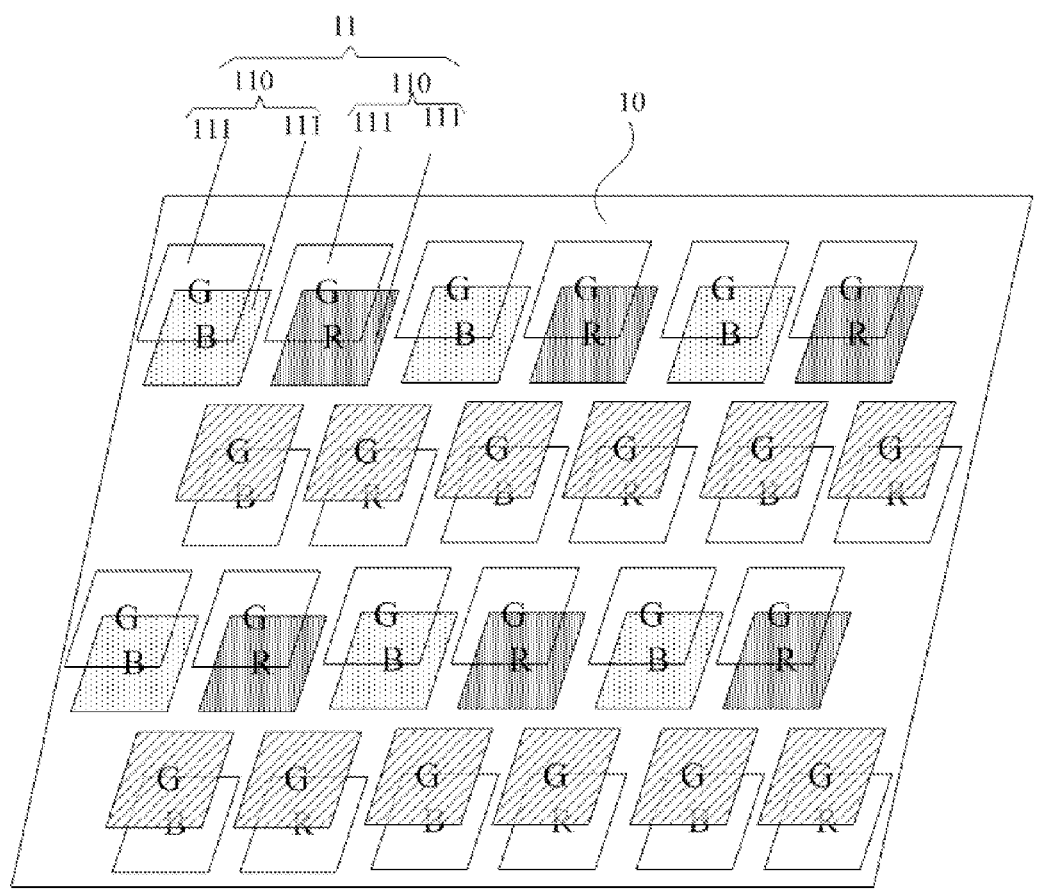
FIG. 7b is a schematic diagram of the OLED display unit as shown in FIG. 7a in the case of achieving virtual display.

For instance, in the OLED display unit as shown in FIG. 7a, not only the perfect display effect can be achieved but also the RGB virtual display pixel arrangement mode can be achieved by controlling different selector switches to be switched on. For instance, when display using the OLED display unit as shown in FIG. 7a, selector switches connected with a first layer of subpixel units 111 that are in odd rows of pixel units 11 with the stacked structure are switched on, where the first layer of subpixel units 111 is a layer close to a base substrate 10; and selector switches connected with a second layer of subpixel units 111 that are in the odd rows of pixel units 11 with the stacked structure are switched off, where the second layer of subpixel units 111 is a layer away from the base substrate 10. Meanwhile, selector switches connected with a first layer of subpixel units 111 that are in even rows of pixel units 11 with the stacked structure are switched off, where the first layer of subpixel units is a layer close to the base substrate 10; and selector switches connected with a second layer of subpixel units 111 that are in the even rows of pixel units 11 with the stacked structure are switched on, where the second layer of subpixel units 111 is a layer away from the base substrate 10. The specific effect is shown in FIG. 7b. Each subpixel unit stacked group 110 can achieve virtual display by adoption of the periodic pixel color borrowing means known by those skilled in the art.

Figure 8A:
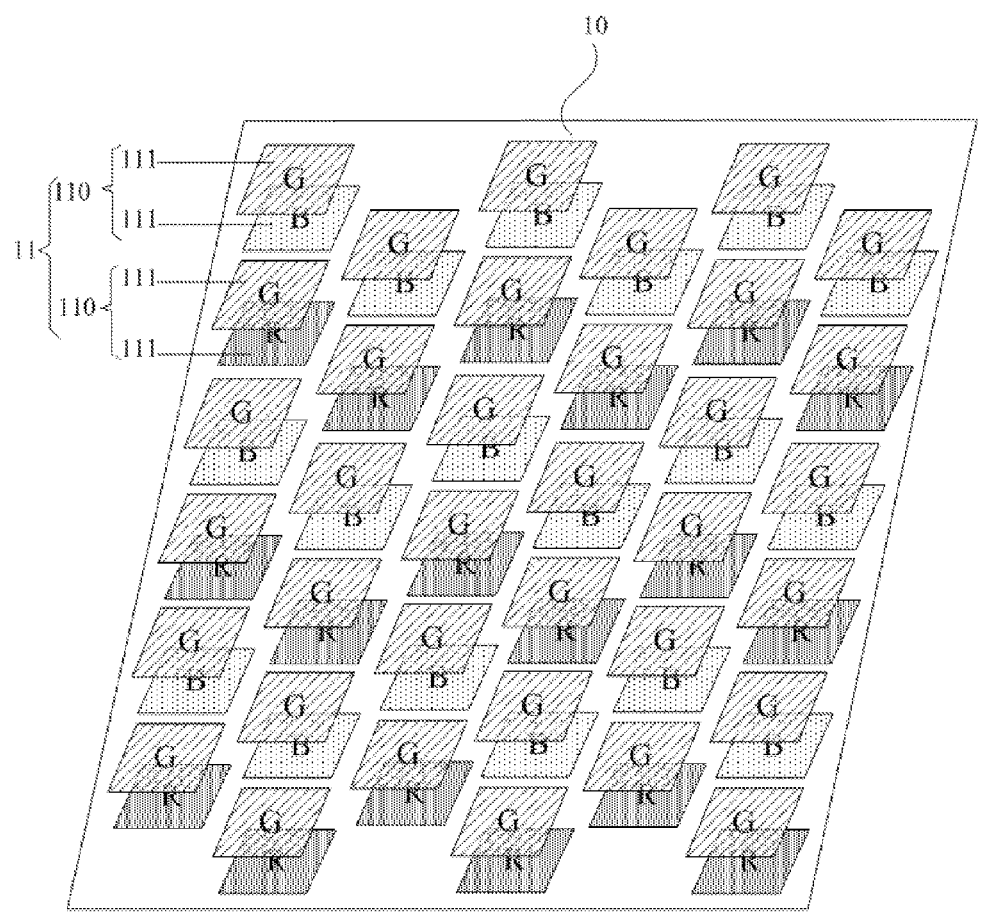
FIG. 8a is a schematic structural view of an OLED display unit provided by embodiments of the present disclosure.

Or in at least one embodiment, in the OLED display unit provided by the embodiments of the present disclosure, as illustrated in FIG. 8a, all of the pixel units 11 are pixel units 11 each with the stacked structure; all of the pixel units 11 with the stacked structure are regularly arranged; in each pixel unit 11 with the stacked structure, two subpixel unit stacked groups 110 are adjacent to each other along the column direction; arrangement positions of odd columns of pixel units each with the stacked structure correspond to each other, and arrangement positions of even columns of pixel units each with the stacked structure correspond to each other; and in two adjacent columns of pixel units 11 with the stacked structure, two subpixel unit stacked groups 110 which are adjacent to each other in position and have same structure are misaligned.

Figure 8B:
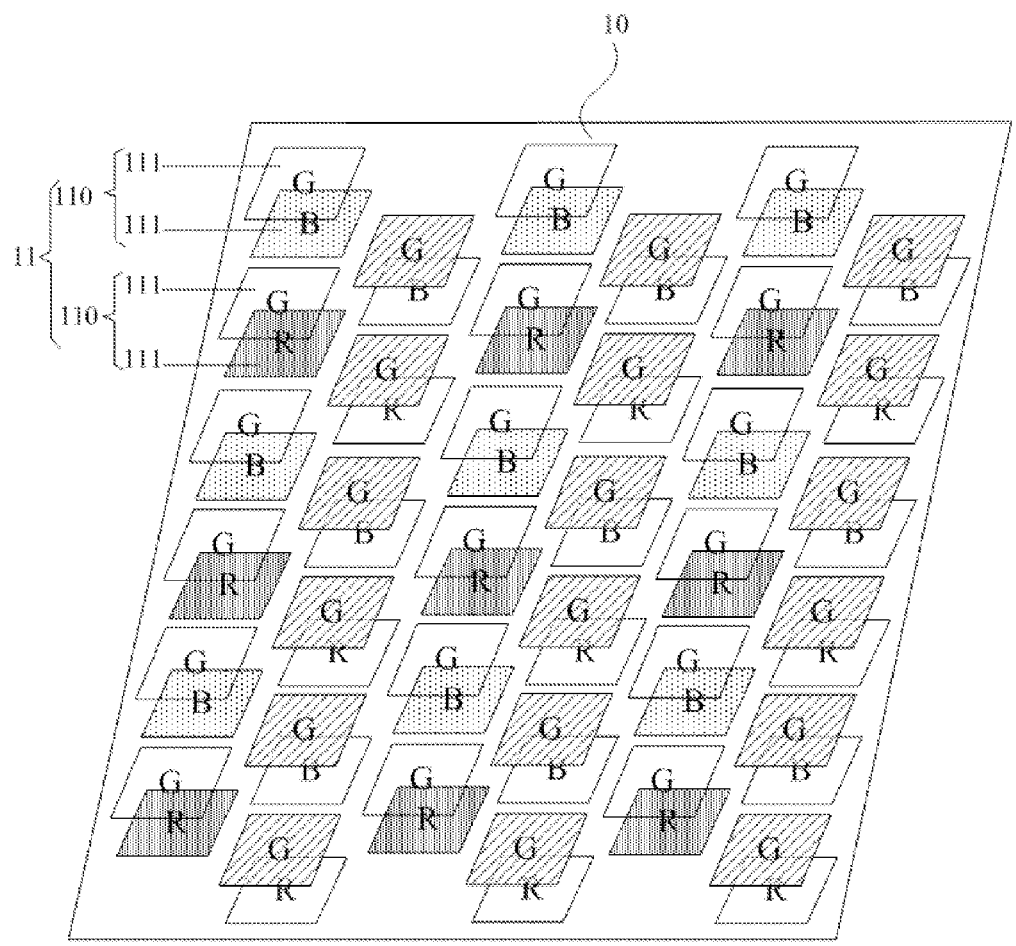
FIG. 8b is a schematic diagram of the OLED display unit as shown in FIG. 8a in the case of achieving virtual display.

For instance, in the OLED display unit as shown in FIG. 8a, not only the perfect display effect can be achieved but also the RGB virtual display pixel arrangement mode can be achieved by controlling different selector switches to be switched on. For instance, when display using the OLED display unit as shown in FIG. 8a, selector switches connected with a first layer of subpixel units 111 that are in odd columns of pixel units 11 with the stacked structure are switched off, where the first layer of subpixel units 111 is a layer close to the base substrate 10; and selector switches connected with a second layer of subpixel units 111 that are in the odd columns of pixel units 11 with the stacked structure are switched on, where the second layer of subpixel units 111 is a layer away from the base substrate 10. Meanwhile, selector switches connected with a first layer of subpixel units 111 that are in even columns of pixel units 11 with the stacked structure are switched on, where the first layer of subpixel units is a layer close to the base substrate 10; and selector switches connected with a second layer of subpixel units 111 that are in the even columns of pixel units 11 with the stacked structure are switched off, where the second layer of subpixel units 111 is a layer away from the base substrate 10. The specific effect is shown in FIG. 8b. Each subpixel unit stacked group 110 can achieve virtual display by adoption of the periodic pixel color borrowing means known by those skilled in the art.

For instance, in the OLED display unit provided by the embodiments of the present disclosure, the pixel circuits have a compensation function and can effectively compensate the unevenness and the drift of the threshold voltage of the driving transistors in the pixel circuits, as well as the current difference caused by the unevenness of the OLEDs. There are many types of pixel circuits with compensation function in the field. No limitation will be placed herein.

Figure 9:
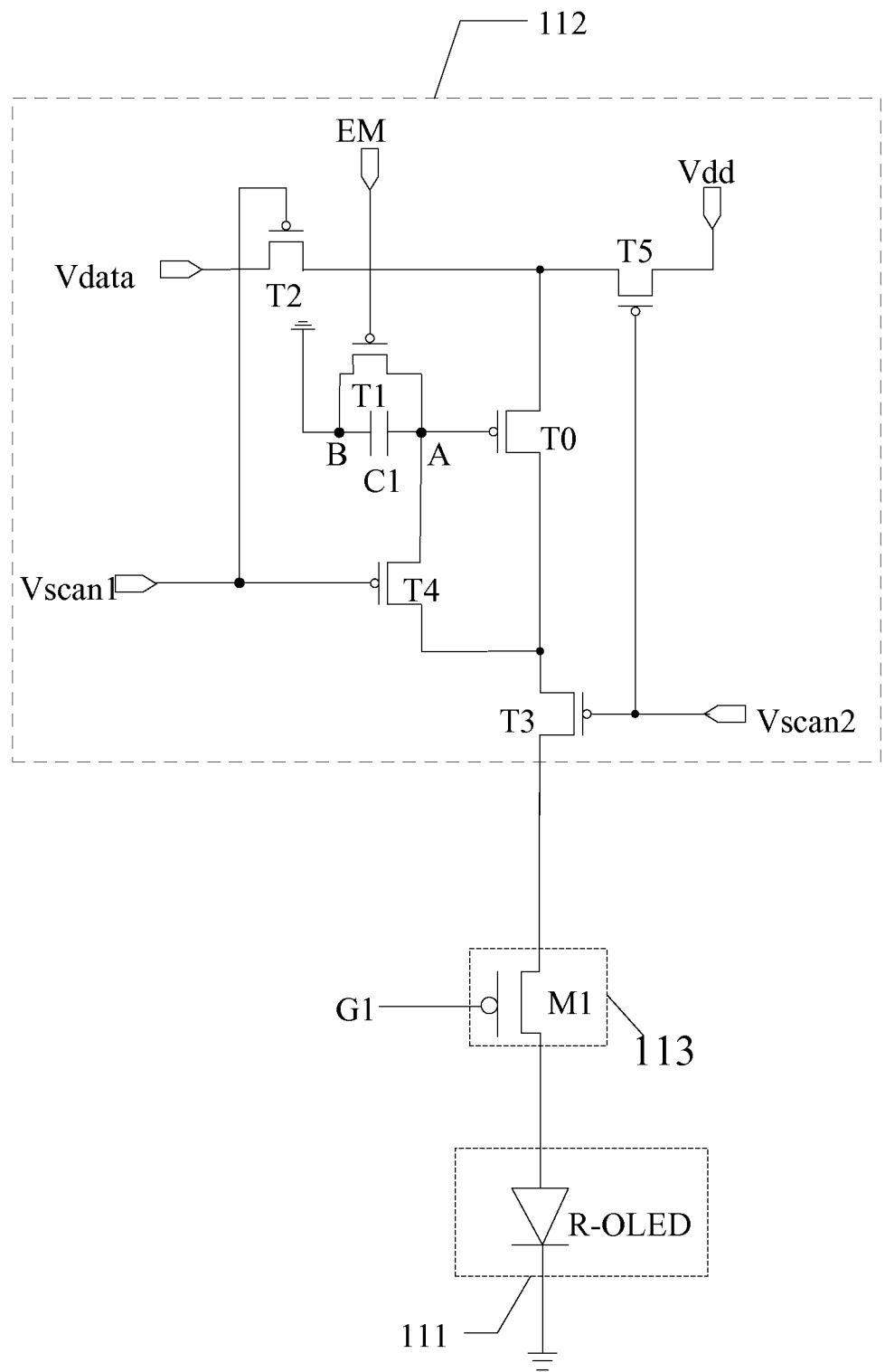
FIG. 9 is a specific circuit diagram of a pixel circuit provided by embodiments of the present disclosure.

The OLED display unit provided by the embodiments of the present disclosure will be described below with reference to a pixel circuit with a compensation function. For instance, as illustrated in FIG. 9, the pixel circuit 112 may include: a driving transistor T0, a first switching transistor T1, a second switching transistor T2, a third switching transistor T3, a fourth switching transistor T4, a fifth switching transistor T5 and a capacitor C1. As for the first switching transistor T1, a source electrode is connected with a reference voltage terminal; a drain electrode is connected with a gate electrode of the driving transistor T0; and a gate electrode is configured to receive a first control signal EM. As for the second switching transistor T2, a gate electrode is configured to receive a first scanning signal Vscan1; a drain electrode is connected with a source electrode of the driving transistor T0; and a source electrode is configured to receive a data voltage signal $V_{data}$. As for the third switching transistor T3, a gate electrode is configured to receive a second scanning signal Vscan2; a source electrode is connected with a drain electrode of the driving transistor T0; and a drain electrode is connected with a corresponding subpixel unit 111. As for the fourth switching transistor T4, a source electrode is connected with the gate electrode of the driving transistor T0; a drain electrode is connected with the drain electrode of the driving transistor T0; and a gate electrode is configured to receive the first scanning signal Vscan1. As for the fifth switching transistor T5, a gate electrode is configured to receive the second scanning signal Vscan2; a source electrode is connected with the power voltage $V_{dd}$; and a drain electrode is connected with the source electrode of the driving transistor T0. The capacitor C1 is connected between the reference voltage terminal and the gate electrode of the driving transistor T0.

For instance, in a specific implementation, in the OLED display unit provided by the embodiments of the present disclosure, the transistors are generally transistors made from the same materials. For instance, in a specific implementation, all the transistors are P-type transistors or N-type transistors. The N-type transistors are switched off under the action of a low voltage level and switched on under the action of a high voltage level. The P-type transistors are switched off under the action of a high voltage level and switched on under the action of a low voltage level.

It should be noted that the switching transistors and the driving transistor referred to in the above embodiments of the present disclosure may be TFTs and may also be metal-oxide-semiconductor field-effect transistors (MOSFETs). No limitation will be placed here. In a specific implementation, the functions of the source electrodes and the drain electrodes of the transistors can be interchanged according to different transistor types and different input signals. No specific distinction will be given here.

Figure 10:
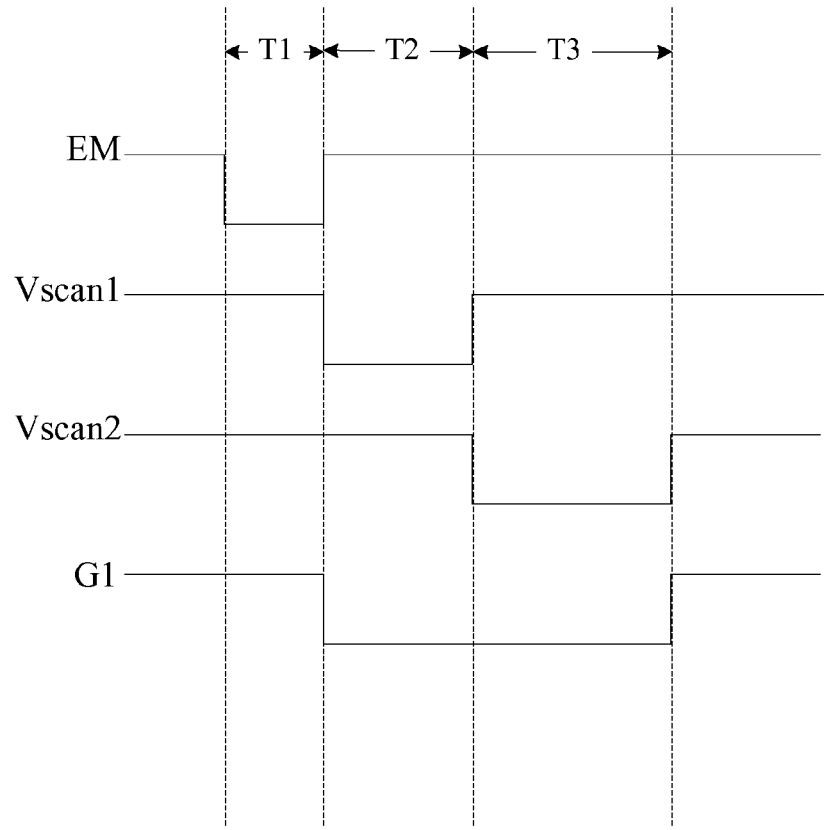
FIG. 10 is a circuit timing diagram of the pixel circuit as shown in FIG. 9.

A display process of a subpixel unit of the OLED display unit provided by the embodiments of the present disclosure will be described below by taking the pixel circuit as shown in FIG. 9 as an example. For instance, in FIG. 9, the driving transistor and all the switching transistors are all P-type transistors; a connection point between the drain electrode of the first switching transistor and the gate electrode of the driving transistor is taken as a first node A; and a connection point between the capacitor and the reference voltage terminal is taken as a second node B. A control timing sequence is shown in FIG. 10, and a display process of displaying each image frame includes three stages T1 to T3. Suppose that the control signal G1 controls the selector switch M1 to be switched on when displaying the current image frame, so that a subpixel unit for emitting red light (R-OLED) is driven to display and emit light. A specific display process is as follows.

In the T1 stage, Vscan1, Vscan2 and G1 are in a high voltage level, and EM is in a low voltage level. At this point, the switching transistor T1 is switched on, and T2, T3, T4, T5 and M1 are switched off; charges stored in the first node A are released through T1; a voltage signal of the gate electrode of the driving transistor T0 is reset; and the driving transistor T0 is switched on.

In the T2 stage, Vscan1 and G1 are in a low voltage level, and Vscan2 and EM are in a high voltage level; the switching transistors T2, T4 and M1 are switched on and T1, T3 and T5 are switched off; and the driving transistor T0 continues to maintain the on state. Due to T4 being in an on state, the gate electrode and the drain electrode of the driving transistor T0 are connected together; and the first node A is charged by the data signal $V_{data}$ through the driving transistor T0, so that the voltage of the first node A can be raised until the voltage of the first node A is $V_{data}-V_{th}$. At this point, the quantity of electric charges Q of the capacitor C1 is as follows:

$$Q=C\cdot(V_2-V_1)=C\cdot(V_{REF}+V_{th}-V_{data}) \qquad (1),$$

where $V_1$ refers to the voltage of the first node A at this point and is equal to $V_{data}-V_{th}$; and $V_2$ refers to the voltage of the second node B at this point and is equal to the voltage $V_{REF}$ of the reference voltage terminal. In the present disclosure, the reference voltage terminal is grounded, so the voltage $V_{REF}$ is 0.

In the T3 stage, Vscan2 and G1 are in a low voltage level and scan1 and EM are in a high voltage level. Thus, the switching transistors T3, T5 and M1 are switched on and T1, T2 and T4 are switched off; the capacitor C1 maintains the voltage of the gate electrode of the driving transistor T0 to be still $V_{data}-V_{th}$; and the voltage of the source electrode of the driving transistor T0 is the power voltage $V_{dd}$. In order to ensure the driving transistor T0 being in the on state at this stage, when designed, the power voltage $V_{dd}$ is less than the data signal voltage $V_{data}$ and drives the B-OLED to emit light, $$V_{gs}=V_s-V_g=V_{dd}+V_{th}-V_{data} \quad (2).$$

The gate source voltage Vgs of the driving transistor T0 is maintained to be $V_{dd}+V_{th}-V_{data}$. At this point, the current of the driving transistor T0 is as follows:

$$I_{OLED} = \frac{1}{2} \cdot \mu_n \cdot Cox \cdot \frac{W}{L} \cdot [V_{dd} - V_{data} + V_{th} - V_{th}]^2 \quad (3)$$
$$= \frac{1}{2} \cdot \mu_n \cdot Cox \cdot \frac{W}{L} \cdot [V_{dd} - V_{data}]^2.$$

As known from the above formula, the current of the driving transistor T0 is only relevant to the power voltage $V_{dd}$ and the data voltage $V_{data}$ and irrelevant to the threshold voltage $V_{th}$. Therefore, the influence of the unevenness and the drift of the threshold voltage of the driving transistor and the unevenness of the electrical properties of the OLED structures can be eliminated, and hence the display effect can be further guaranteed.

The above embodiments are only described by taking the pixel circuit as shown in FIG. 9 as an example. The working principle of the display process of all the subpixel units in the embodiments of the present disclosure is the same with the above description. No further description will be given here.

Figure 11:
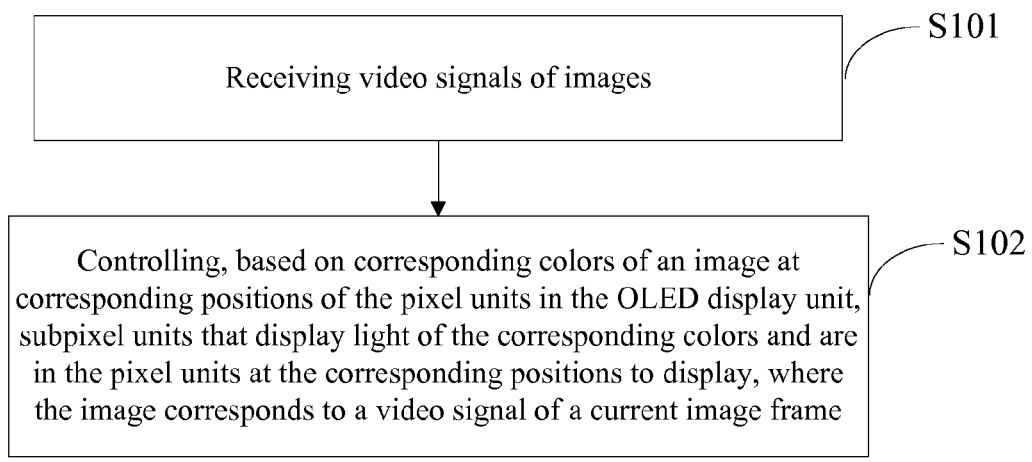
FIG. 11 is a flowchart of a method for driving the OLED display unit, provided by embodiments of the present disclosure.

Based on the same inventive concept, at least one embodiment of the present disclosure further provides a method for driving the OLED display unit described above. As illustrated in FIG. 11, the method may comprise the following steps: S101 that includes receiving video signals of images; and S102 that includes controlling, based on corresponding colors of an image at corresponding positions of the pixel units in the OLED display unit, subpixel units that display light of the corresponding colors and that are in the pixel units at the corresponding positions to display, where the image corresponds to a video signal of a current image frame.

In the above driving method, each subpixel unit stacked group in each pixel unit with the stacked structure is controlled to display light of at least two colors according to video signals of a plurality of image frames. That is to say, in the process of displaying a plurality of image frames, the on or off state of each subpixel unit in each subpixel unit stacked group can be controlled, so that each subpixel unit stacked group can display light of at least two colors (that is, displaying the gray-scale effect of at least two colors).

In the method for driving the OLED display unit provided by the embodiments of the present disclosure, subpixel units for displaying light of corresponding colors in pixel units at corresponding positions can be controlled to display based on the color of an image at the positions of the pixel units in the OLED display unit, where the image corresponds to a video signal of the current image frame. Because part of the pixel units in the OLED display unit are pixel units with the stacked structure, each subpixel unit stacked group in each pixel unit with the stacked structure can display the gray-scale of a plurality of colors. Thus, compared with the case that a subpixel unit can only display the gray-scale effect of one color, a subpixel unit stacked group can be utilized to replace the subpixel unit that can only display the gray-scale effect of one color. Thus, the number of the colors displayed by each subpixel unit stacked group is increased compared to the subpixel unit that can only display the gray-scale effect of one color, and hence the display effect can be improved.

Figure 12:
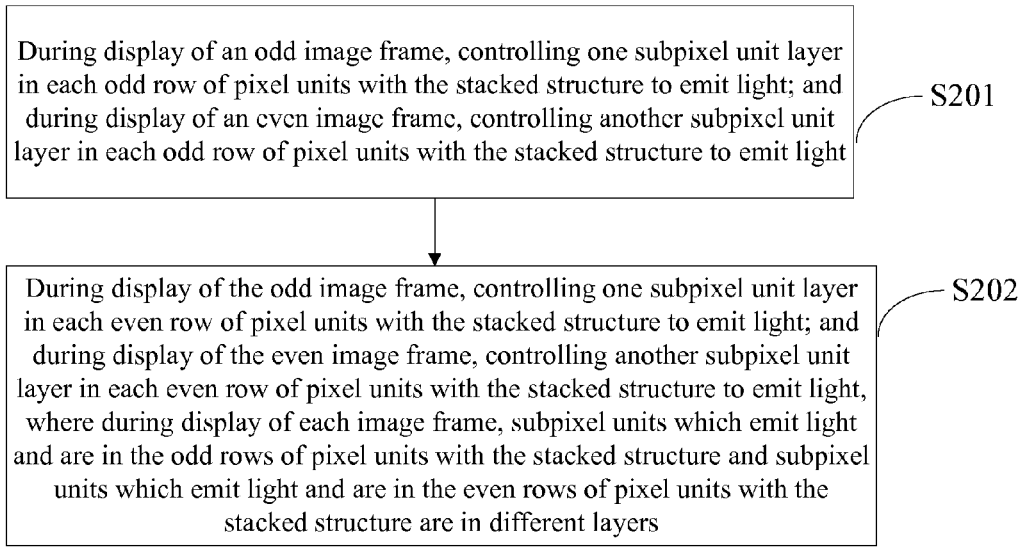

Based on the same inventive concept, correspondingly, for a structure that is the OLED display unit as shown in FIG. 7a, at least one embodiment of the present disclosure further provides a driving method. That is, in the OLED display unit, all the pixel units 11 are pixel units 11 each with the stacked structure, and all the pixel units 11 each with the stacked structure are regularly arranged; in each pixel unit 11 with the stacked structure, two subpixel unit stacked groups 110 are adjacent to each other along the row direction; arrangement positions of odd rows of pixel units 11 with the stacked structure correspond to each other, and arrangement positions of even rows of pixel units 11 with the stacked structure correspond to each other; and in two adjacent rows of pixel units 11 with the stacked structure, two subpixel unit stacked groups 110 which are adjacent to each other in position and have the same structure are misaligned. As illustrated in FIG. 12, the driving method comprises the following steps S201 and S202. The steps will be described below one by one.

S201: during display of an odd image frame, controlling one subpixel unit layer in each odd row of pixel units with the stacked structure to emit light; and during display of an even image frame, controlling another subpixel unit layer in each odd row of pixel units with the stacked structure to emit light.

S202: during display of the odd image frame, controlling one subpixel unit layer in each even row of pixel units with the stacked structure to emit light; and during display of the even image frame, controlling another subpixel unit layer in each even row of pixel units with the stacked structure to emit light. Moreover, during display of each image frame, subpixel units which emit light and are in the odd rows of pixel units with the stacked structure and subpixel units which emit light and are in the even rows of pixel units with the stacked structure are in different layers.

For instance, during displaying an odd image frame: a layer of subpixel units that are in odd rows of pixel units with the stacked structure is controlled to emit light, where the layer of subpixel units in the odd rows is a layer close to a base substrate; and a layer of subpixel units that are in even rows of pixel units with the stacked structure is controlled to emit light, where the layer of subpixel units in the even rows is a layer away from the base substrate. During displaying an even image frame: a layer of subpixel units that are in the odd rows of pixel units with the stacked structure is controlled to emit light, where the layer of subpixel units in the odd rows is a layer away from the base substrate; and a layer of subpixel units that are in the even rows of pixel units with the stacked structure is controlled to emit light, where the layer of the subpixel units in the even rows is a layer close to the base substrate. Or, during displaying an odd image frame: a layer of subpixel units that are in even rows of pixel units with the stacked structure is controlled to emit light, where the layer of subpixel units in the even rows is a layer close to the base substrate; and a layer of subpixel units that are in odd rows of pixel units with the stacked structure is controlled to emit light, where the layer of subpixel units in the odd rows is a layer away from the base substrate. During displaying an even image frame: a layer of subpixel units that are in the even rows of pixel units with the stacked structure is controlled to emit light, where the layer of subpixel units in the even rows is a layer away from the base substrate; and a layer of subpixel units that are in the odd rows of pixel units with the stacked structure is controlled to emit light, where the layer of subpixel units in the odd rows is a layer close to the base substrate.

As such, for two adjacent image frames, different subpixel units are adopted to achieve the virtual display pixel arrangement effect. Moreover, as the subpixel units only display during a time duration of one image frame for two image frames, the service life of the OLED display unit can be prolonged on the basis of achieving virtual display.

Figure 13:
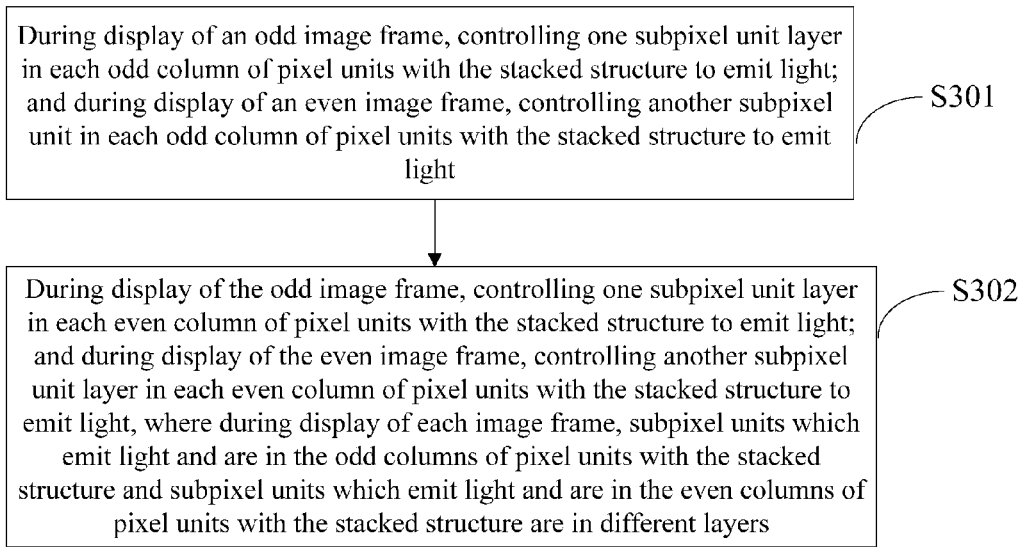

Correspondingly, for a structure that is the OLED display unit as shown in FIG. 8a, at least one embodiment of the present disclosure further provides a driving method. That is, in the OLED display unit, all the pixel units 11 are pixel units 11 each with the stacked structure, and all the pixel units 11 each with the stacked structure are regularly arranged; in each pixel unit 11 with the stacked structure, two subpixel unit stacked groups 110 are adjacent to each other along the column direction; arrangement positions of odd columns of pixel units 11 with the stacked structure correspond to each other, and arrangement positions of even columns of pixel units 11 with the stacked structure correspond to each other; and in two adjacent columns of pixel units 11 with the stacked structure, two subpixel unit stacked groups 110 which are adjacent to each other in position and have the same structure are misaligned. As illustrated in FIG. 13, the driving method comprises the steps S301 and S302. The steps will be described below one by one.

S301: during display of an odd image frame, controlling one subpixel unit layer in each odd column of pixel units with the stacked structure to emit light; and during display of an even image frame, controlling another subpixel unit layer in each odd column of pixel units with the stacked structure to emit light.

S302: during display of the odd image frame, controlling one subpixel unit layer in each even column of pixel units with the stacked structure to emit light; and during display of the even image frame, controlling another subpixel unit layer in each even column of pixel units with the stacked structure to emit light. Moreover, during display of each image frame, subpixel units which emit light and are in the odd columns of pixel units with the stacked structure and subpixel units which emit light and are in the even columns of pixel units with the stacked structure are in different layers.

For instance, during displaying an odd image frame: a layer of subpixel units that are in odd columns of pixel units with the stacked structure is controlled to emit light, where the layer of subpixel units in the odd columns is a layer close to a base substrate; and a layer of subpixel units that are in even columns of pixel units with the stacked structure is controlled to emit light, where the layer of subpixel units in the even columns is a layer away from the base substrate. During displaying an even image frame: a layer of subpixel units that are in the odd columns of pixel units with the stacked structure is controlled to emit light, where the layer of subpixel units in the odd columns is a layer away from the base substrate; and a layer of subpixel units that are in the even columns of pixel units with the stacked structure is controlled to emit light, where the layer of the subpixel units in the even columns is a layer close to the base substrate. Or, during displaying an odd image frame: a layer of subpixel units that are in even columns of pixel units with the stacked structure is controlled to emit light, where the layer of subpixel units in the even columns is a layer close to the base substrate; and a layer of subpixel units that are in odd columns of pixel units with the stacked structure is controlled to emit light, where the layer of subpixel units in the odd columns is a layer away from the base substrate. During displaying an even image frame: a layer of subpixel units that are in the even columns of pixel units with the stacked structure is controlled to emit light, where the layer of subpixel units in the even columns is a layer away from the base substrate; and a layer of subpixel units that are in the odd columns of pixel units with the stacked structure is controlled to emit light, where the layer of subpixel units in the odd columns is a layer close to the base substrate.

As such, for two adjacent image frames, different subpixel units are adopted to achieve the virtual display pixel arrangement effect. Moreover, as the subpixel units only display in a time duration of one image frame for two image frames, the service life of the OLED display unit can be prolonged on the basis of achieving virtual display.

Based on the same inventive concept, at least one embodiment of the present disclosure further provides a display device, which comprises any foregoing OLED display unit provided by the embodiments of the present disclosure. The display device may include: any product or component with a display function such as a mobile phone, a tablet PC, a TV, a display, a notebook computer, a digital picture frame and a navigator, etc. All the other necessary components of the display device should be understood by those skilled in the art, should not be further described here, and should not be construed as the limitation of the present disclosure. The embodiments of the display device may refer to the embodiments of the foregoing OLED display unit. No further description will be given here.

In the OLED display unit, the driving method thereof and the display device provided by the embodiments of the present disclosure, at least part of pixel units are pixel units each with a stacked structure; each pixel unit with the stacked structure includes two adjacent subpixel unit stacked groups; each subpixel unit stacked group includes at least two subpixel units which have different emitting colors and are stacked and insulated from each other; and the number of the subpixel units in each of the subpixel unit stacked groups of the same pixel unit with the stacked structure is the same. Therefore, during display of different image frames, each subpixel unit stacked group in each pixel unit with the stacked structure can display the gray-scale effect of at least two colors according to applied signals. Compared with the case that each subpixel unit can only display the gray-scale effect of one color for different image frames, the OLED display unit described above can improve the display effect because each subpixel unit stacked group can display more colors. In addition, in each same pixel unit with the stacked structure from the pixel units each with the stacked structure, only one subpixel unit layer includes two subpixel units that have the same emitting color, and one or more other subpixel unit layers each include two subpixel units that have different emitting colors. Therefore, during display, the virtual display pixel arrangement effect can be also achieved by the control of the light emission of the subpixel units in different layers.

The foregoing is only the preferred embodiments of the present disclosure and not intended to limit the scope of protection of the present disclosure. The scope of protection of the present disclosure should be defined by the appended claims.

The application claims priority to the Chinese patent application No. 201410515749.X, filed on Sep. 29, 2014, the disclosure of which is incorporated herein by reference in its entirety as part of the application.

The invention claimed is:

1. An organic light-emitting diode (OLED) display unit, comprising a base substrate and a plurality of pixel units disposed on the base substrate, the plurality of pixel units including a plurality of subpixel units and pixel circuits which are respectively connected with the subpixel units in a one-to-one correspondence, wherein:
the subpixel units are OLED structures, and pixel circuits in a same pixel unit are respectively connected with different data signal lines;
at least part of the pixel units are pixel units each with a stacked structure, and each of the pixel units with the stacked structure includes two adjacent subpixel unit stacked groups;
each subpixel unit stacked group includes at least two subpixel units which have different emitting colors and are stacked and insulated from each other, and a quantity of subpixel units in each subpixel unit stacked group of a same pixel unit with the stacked structure is identical;
in each pixel unit with the stacked structure, two subpixel units disposed in a same layer form a subpixel unit layer; and in a same pixel unit with the stacked structure, only one subpixel unit layer includes two subpixel units that have same emitting colors, and one or more other subpixel unit layers each include two subpixel units that have different emitting colors.

2. The OLED display unit according to claim 1, wherein subpixel units in a same pixel unit with the stacked structure are respectively connected with corresponding pixel circuits through corresponding selector switches; and
the selector switches are configured to respectively receive corresponding control signals which are used for controlling switching on or switching off of the selector switches.

3. The OLED display unit according to claim 1, wherein in each pixel unit with the stacked structure, each subpixel unit stacked group includes two subpixel units; and emitting colors of four subpixel units in each pixel unit with the stacked structure are respectively red (R), blue (B), green (G) and red (R), or R, B, G and B, or R, B, G and G.

4. The OLED display unit according to claim 3, wherein a sequence of the emitting colors of the four subpixel units in each pixel unit with the stacked structure is identical.

5. The OLED display unit according to claim 3, wherein all of the pixel units are pixel units each with the stacked structure.

6. The OLED display unit according to claim 3, wherein:
each of the OLED structures includes an anode, an light emission layer and a cathode which are stacked in sequence; and
electric potentials of cathodes in corresponding OLED structures of a same pixel unit with the stacked structure are equal or unequal.

7. The OLED display unit according to claim 2, wherein each of the selector switches is a switching transistor;
a gate electrode of the switching transistor is configured to receive a corresponding control signal; a source electrode of the switching transistor is connected with a corresponding pixel circuit; and a drain electrode of the switching transistor is connected with a corresponding subpixel unit.

8. The OLED display unit according to claim 2, wherein in each pixel unit with the stacked structure, each subpixel unit stacked group includes two subpixel units; and emitting colors of four subpixel units in each pixel unit with the stacked structure are respectively red (R), blue (B), green (G) and red (R), or R, B, G and B, or R, B, G and G.

9. The OLED display unit according to claim 2, wherein all of the pixel units are pixel units each with the stacked structure.

10. The OLED display unit according to claim 2, wherein:
each of the OLED structures includes an anode, an light emission layer and a cathode which are stacked in sequence; and
electric potentials of cathodes in corresponding OLED structures of a same pixel unit with the stacked structure are equal or unequal.

11. The OLED display unit according to claim 1, wherein all of the pixel units are pixel units each with the stacked structure.

12. The OLED display unit according to claim 11, wherein all of the pixel units with the stacked structure are arranged in a matrix; and in each pixel unit with the stacked structure, two subpixel unit stacked groups are adjacent to each other along a row direction or a column direction.

13. The OLED display unit according to claim 11, wherein all of the pixel units with the stacked structure are regularly arranged;
in each pixel unit with the stacked structure, two subpixel unit stacked groups are adjacent to each other along a row direction;
arrangement positions of odd rows of pixel units with the stacked structure correspond to each other, and arrangement positions of even rows of pixel units with the stacked structure correspond to each other; and in two adjacent rows of pixel units with the stacked structure, two subpixel unit stacked groups which are adjacent to each other in position and have a same structure are misaligned.

14. A method for driving the OLED display unit according to claim 13, comprising:
during display of an odd image frame, controlling one subpixel unit layer in each odd row of pixel units with the stacked structure to emit light, and during display of an even image frame, controlling another subpixel unit layer in each odd row of pixel units with the stacked structure to emit light; and
during display of the odd image frame, controlling one subpixel unit layer in each even row of pixel units with the stacked structure to emit light, and during display of the even image frame, controlling another subpixel unit layer in each even row of pixel units with the stacked structure to emit light,
wherein during display of each image frame, subpixel units which emit light and are in the odd rows of pixel units with the stacked structure and subpixel units which emit light and are in the even rows of pixel units with the stacked structure are in different layers.

15. The OLED display unit according to claim 11, wherein all of the pixel units with the stacked structure are regularly arranged;
in each pixel unit with the stacked structure, two subpixel unit stacked groups are adjacent to each other along a column direction;

arrangement positions of odd columns of pixel units with the stacked structure correspond to each other, and arrangement positions of even columns of pixel units with the stacked structure correspond to each other; and in two adjacent columns of pixel units with the stacked structure, two subpixel unit stacked groups which are adjacent to each other in position and have a same structure are misaligned.

16. A method for driving the OLED display unit according to claim 15, comprising:

during display of an odd image frame, controlling one subpixel unit layer in each odd column of pixel units with the stacked structure to emit light, and during display of an even image frame, controlling another subpixel unit layer in each odd column of pixel units with the stacked structure to emit light; and during display of the odd image frame, controlling one subpixel unit layer in each even column of pixel units with the stacked structure to emit light, and during display of the even image frame, controlling another subpixel unit layer in each even column of pixel units with the stacked structure to emit light, wherein during display of each image frame, subpixel units which emit light and are in the odd columns of pixel units with the stacked structure and subpixel units which emit light and are in the even columns of pixel units with the stacked structure are in different layers.

17. The OLED display unit according to claim 1, wherein:

each of the OLED structures includes an anode, an light emission layer and a cathode which are stacked in sequence; and electric potentials of cathodes in corresponding OLED structures of a same pixel unit with the stacked structure are equal or unequal.

18. A method for driving the OLED display unit according to claim 1, comprising:

receiving video signals of images; and controlling, based on corresponding colors of an image at corresponding positions of the pixel units in the OLED display unit, subpixel units that display light of the corresponding colors and that are in the pixel units at the corresponding positions to display, wherein the image corresponds to a video signal of a current image frame.

19. The driving method according to claim 18, wherein each subpixel unit stacked group in each pixel unit with the stacked structure is controlled to display light of at least two colors based on video signals of a plurality of image frames.

20. A display device, comprising the OLED display unit according to claim 1.

* * * * *